United States Patent
Hinohara et al.

(10) Patent No.: US 11,358,306 B2
(45) Date of Patent: Jun. 14, 2022

(54) PEELING APPARATUS

(71) Applicant: DISCO CORPORATION, Tokyo (JP)

(72) Inventors: Kazuyuki Hinohara, Tokyo (JP); Ryohei Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 871 days.

(21) Appl. No.: 16/199,576

(22) Filed: Nov. 26, 2018

(65) Prior Publication Data

US 2019/0160708 A1    May 30, 2019

(30) Foreign Application Priority Data

Nov. 29, 2017   (JP) .............................. JP2017-228802

(51) Int. Cl.
| | | |
|---|---|---|
| *B28D 5/00* | (2006.01) | |
| *B23K 26/364* | (2014.01) | |
| *B23K 20/233* | (2006.01) | |
| *B23K 26/0622* | (2014.01) | |
| *B28D 5/04* | (2006.01) | |
| *B23K 26/00* | (2014.01) | |
| *B23K 26/08* | (2014.01) | |
| *B23K 20/10* | (2006.01) | |
| *B23K 26/53* | (2014.01) | |

(Continued)

(52) U.S. Cl.
CPC ............ *B28D 5/0094* (2013.01); *B23K 20/10* (2013.01); *B23K 20/233* (2013.01); *B23K 26/0006* (2013.01); *B23K 26/0622* (2015.10); *B23K 26/0823* (2013.01); *B23K 26/0853* (2013.01); *B23K 26/364* (2015.10); *B23K 26/53* (2015.10); *B23K 26/702* (2015.10); *B28D 5/0011* (2013.01); *B28D 5/0076* (2013.01); *B28D 5/047* (2013.01); *B23K 2101/40* (2018.08); *B23K 2103/56* (2018.08)

(58) Field of Classification Search
CPC .. B23K 26/0622; B23K 26/364; B23K 26/53; B23K 26/0006; B23K 26/0823; B23K 26/0853; B23K 26/50; B23K 20/10; B28D 5/0094; B28D 5/0011; B28D 5/047
USPC ......................................... 219/121.6, 121.61
See application file for complete search history.

(56) References Cited

U.S. PATENT DOCUMENTS

2016/0013613 A1*   1/2016   Koyanagi ........... H01L 33/0093
                                                            156/712
2016/0158882 A1*   6/2016   Hirata ..................... H01L 21/78
                                                            125/23.01

(Continued)

FOREIGN PATENT DOCUMENTS

| JP | 2000094221 A | 4/2000 |
|---|---|---|
| JP | 2011060862 A | 3/2011 |
| JP | 2016111143 A | 6/2016 |

*Primary Examiner* — Tu B Hoang
*Assistant Examiner* — Alba T Rosario-Aponte
(74) *Attorney, Agent, or Firm* — Greer, Burns & Crain, Ltd.

(57) ABSTRACT

A peeling apparatus includes: an ingot holding unit holding an ingot with an ingot portion corresponding to a wafer being faced up; an ultrasonic wave oscillating unit which has an end face facing the ingot portion corresponding to the wafer and oscillates an ultrasonic wave; a water supplying unit supplying water to an area between the ingot portion corresponding to the wafer and the end face of the ultrasonic wave oscillating unit; and a peeling unit that holds the ingot portion corresponding to the wafer with suction and peels off the wafer from the ingot.

6 Claims, 5 Drawing Sheets

(51) Int. Cl.
  *B23K 26/70* (2014.01)
  *B23K 103/00* (2006.01)
  *B23K 101/40* (2006.01)

(56) References Cited

U.S. PATENT DOCUMENTS

2016/0193691 A1* 7/2016 Hirata .................. C30B 29/36
                                                   225/2
2016/0228983 A1* 8/2016 Hirata .................. B23K 26/032
2016/0228985 A1* 8/2016 Hirata ................ B23K 26/0853

* cited by examiner

PEELING APPARATUS

BACKGROUND OF THE INVENTION

Field of the Invention

The present invention relates to a peeling apparatus for peeling off a wafer from an ingot in which a modified layer has been formed.

Description of the Related Art

Devices such as integral circuits (ICs), large-scale integrations (LSIs) and light emitting diodes (LEDs) are formed by forming a functional layer on a front side of a wafer formed from Si (silicon), $Al_2O_3$ (sapphire) or the like and partitioning the functional layer by a plurality of division lines (streets). In addition, devices such as power devices and LEDs are formed by forming a functional layer on a front side of a wafer formed from SiC (silicon carbide) and partitioning the functional layer by a plurality of division lines. The wafer formed with the devices is divided into individual devices by processing along the division lines by a cutting apparatus or a laser processing apparatus, and the thus divided devices are used for electric apparatuses such as mobile phones and personal computers.

The wafer to be formed with the devices is generally produced by slicing a cylindrical ingot by a wire saw. The front side and the back side of the wafer thus cut are mirror finished by polishing (see, for example, Japanese Patent Laid-open No. 2000-94221). When the ingot is sliced by the wire saw and the front side and the back side of the sliced wafer are polished, however, most part (70% to 80%) of the ingot is discarded, which is uneconomical. Particularly, a single crystal SiC ingot is high in hardness and is difficult to be sliced by a wire saw, so that a considerable time is taken for slicing and productivity is therefore poor. In addition, the ingot is high in unit cost, and has a problem as to efficient wafer production.

In view of the foregoing, the present applicant has proposed a technology in which a laser beam of such a wavelength as to be transmitted through single crystal SiC is applied to a single crystal SiC ingot, with a focal point of the laser beam positioned in the inside of the single crystal SiC ingot, to form a peel-off layer at a scheduled cutting plane, and the wafer is peeled off from the single crystal SiC ingot with the peel-off layer as a starting point of peeling (see, for example, Japanese Patent Laid-open No. 2016-111143).

SUMMARY OF THE INVENTION

However, there remains a problem that it is difficult to peel off of the wafer from the ingot with the peel-off layer as a starting point of peeling and the production efficiency is poor.

In addition, there has been proposed a technology in which a laser beam of such a wavelength as to be transmitted through Si (silicon) is applied to an Si ingot, with a focal point of the laser beam positioned at a depth corresponding to the thickness of a wafer from an end face of the Si ingot, to form a modified layer at a scheduled cutting plane, and the wafer is peeled off from the Si ingot with the modified layer as a starting point of peeling (see, for example, Japanese Patent Laid-open No. 2011-060862). However, it is difficult to peel off the wafer from the Si ingot with the modified layer as a staring point and the production efficiency is poor.

It is therefore an object of the present invention to provide a peeling apparatus by which a wafer can be easily peeled off from an ingot with a peel-off layer as a starting point of peeling.

In accordance with an aspect of the present invention, there is provided a peeling apparatus for peeling off a wafer from an ingot formed therein with a peel-off layer by applying a laser beam of such a wavelength as to be transmitted through the ingot to the ingot, with a focal point of the laser beam positioned at a depth corresponding to the thickness of the wafer, the peeling apparatus including: an ingot holding unit holding the ingot with an ingot portion corresponding to the wafer being faced up; an ultrasonic wave oscillating unit which has an end face facing the ingot portion corresponding to the wafer and which oscillates an ultrasonic wave; a water supplying unit supplying water to an area between the ingot portion corresponding to the wafer and the end face of the ultrasonic wave oscillating unit; and a peeling unit which holds the ingot portion corresponding to the wafer with suction and peels off the wafer from the ingot.

Preferably, the ingot is a single crystal SiC ingot having a c-axis and a c-plane orthogonal to the c-axis, and the peel-off layer is a peel-off layer including a modified portion and a crack, the modified portion and the crack being formed by a process in which a laser beam of such a wavelength as to be transmitted through single crystal SiC is applied to the single crystal SiC ingot, with a focal point of the laser beam positioned at a depth corresponding to the thickness of the wafer from an end face of the single crystal SiC ingot, to form the modified portion in which SiC has been separated into Si and C and the crack which is formed isotropically in the c-plane. It is preferable that the ingot is the single crystal SiC ingot in which the c-axis is inclined relative to a perpendicular to the end face of the single crystal SiC ingot and an off angle is formed by the c-plane and the end face of the single crystal SiC ingot, and the peel-off layer is formed by forming a modified portion continuously in a direction orthogonal to the direction in which the off angle is formed and forming a crack isotropically in the c-plane, and putting the single crystal SiC ingot and the focal point into relative indexing feeding in the direction in which the off angle is formed, in such a range as not to exceed the width of the crack, to form the modified layer continuously in the direction orthogonal to the direction in which the off angle is formed and to sequentially form cracks isotropically in the c-plane from the modified portion.

The peeling apparatus provided by the present invention includes the ingot holding unit adapted to hold the ingot, with the ingot portion corresponding to the wafer being faced up, the ultrasonic wave oscillating unit which has an end face facing the ingot portion corresponding to the wafer and oscillates an ultrasonic wave, the water supplying unit adapted to supply water to an area between the ingot portion corresponding to the wafer and the end face of the ultrasonic wave oscillating unit, and the peeling unit which holds the ingot portion corresponding to the wafer with suction and peels off the wafer from the ingot. Therefore, the wafer can be easily peeled off from the ingot, with the peel-off layer as a starting point of peeling. In addition, in the peeling apparatus of the present invention, water is supplied to the area between the ingot portion corresponding to the wafer and the end face of the ultrasonic wave oscillating unit to form a layer of water, and the ultrasonic wave is transmitted to the ingot through the layer of water. Therefore, the wafer can be peeled off from the ingot without using a water tank, so that the time for filling up the water tank with water and the amount of water to be used can be saved, which is economical.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of a peeling apparatus configured according to the present invention will be described below, referring to the drawings.

Figure 1:
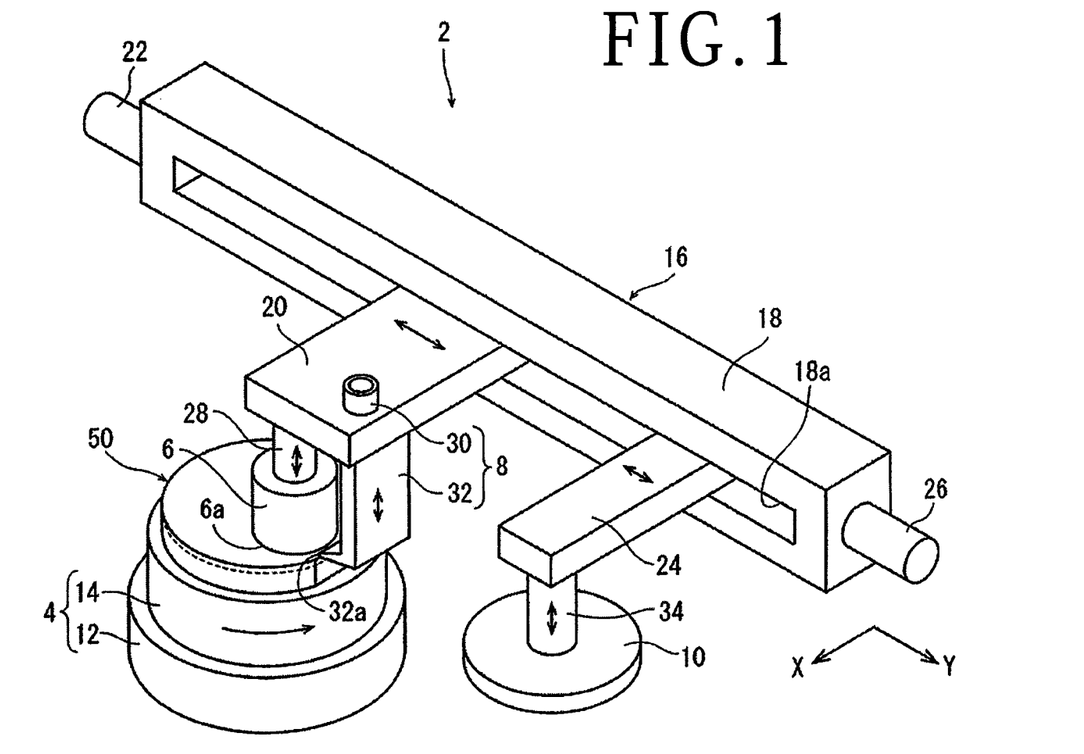
FIG. 1 is a perspective view of a peeling apparatus.

The peeling apparatus denoted as a whole by reference symbol 2 in FIG. 1 includes: an ingot holding unit (ingot holding means) 4 that holds an ingot, with an ingot portion corresponding to a wafer to be produced being faced up; an ultrasonic wave oscillating unit (ultrasonic wave oscillating means) 6 which has an end face 6a facing the ingot portion corresponding to the wafer to be produced and which oscillates an ultrasonic wave; a water supplying unit (water supplying means) 8 for supplying water to an area between the ingot portion corresponding to the wafer to be produced and the end face 6a of the ultrasonic wave oscillating unit 6; and a peeling unit (peeling means) 10 which holds the ingot portion corresponding to the wafer to be produced with suction and which peels off the wafer to be produced from the ingot.

Figure 2:
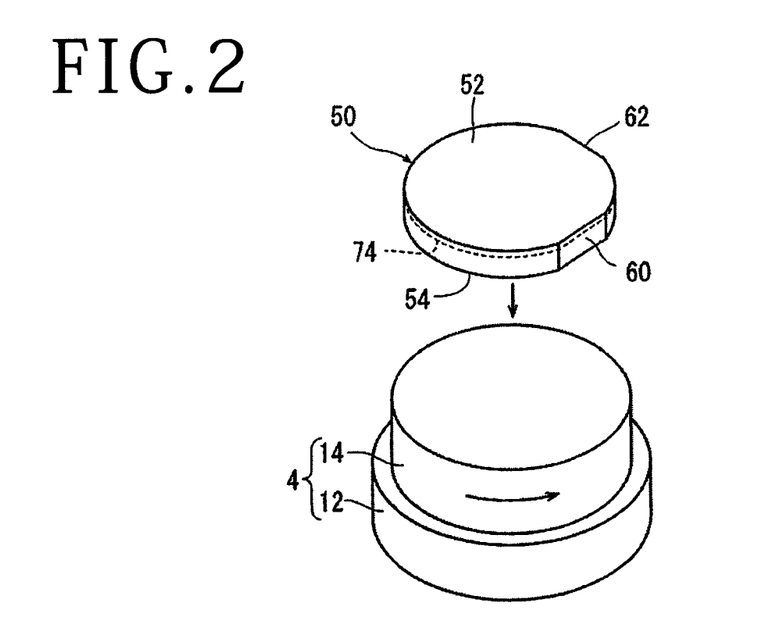
FIG. 2 is a perspective view of the peeling apparatus, depicting the manner in which an ingot is held by an ingot holding unit.

Referring to FIGS. 1 and 2, the ingot holding unit 4 will be described. The ingot holding unit 4 in the present embodiment includes a cylindrical base 12, a cylindrical holding table 14 rotatably mounted on an upper surface of the base 12, and a motor (not depicted) for rotating the holding table 14 around an axis extending in the vertical direction while passing through a radial center of the holding table 14. The ingot holding unit 4 can hold an ingot fixed to the upper surface of the holding table 14 through an appropriate adhesive (for example, an epoxy resin adhesive). Alternatively, the ingot holding unit 4 may have a configuration in which a porous suction chuck (not depicted) connected to suction means (not depicted) is disposed at an upper end portion of the holding table 14, and a suction force is generated at the upper surface of the suction chuck by the suction means, to thereby hold the ingot by suction.

The peeling apparatus 2 in the present embodiment further includes a Y-axis direction moving mechanism 16 for moving the ultrasonic wave oscillating unit 6, the water supplying unit 8, and the peeling unit 10 in a Y-axis direction indicated by arrow Y in FIG. 1. The Y-axis direction moving mechanism 16 includes: a rectangular parallelepiped-shaped frame body 18 formed with a rectangular guide opening 18a extending in the Y-axis direction; a first ball screw (not depicted) extending in the Y-axis direction inside the frame body 18; a first moving piece 20 extending in an X-axis direction indicated by arrow X in FIG. 1 from a base end portion connected to the first ball screw; a first motor 22 connected to one end portion of the first ball screw; a second ball screw (not depicted) extending in the Y-axis direction inside the frame body 18; a second moving piece 24 extending in the X-axis direction from a base end portion connected to the second ball screw; and a second motor 26 connected to one end portion of the second ball screw. The Y-axis direction moving mechanism 16 converts a rotational motion of the first motor 22 into a rectilinear motion, and transmits the rectilinear motion to the first moving piece 20, by the first ball screw, to move the first moving piece 20 in the Y-axis direction along the guide opening 18a, and, in addition, converts a rotational motion of the second motor 26 into a rectilinear motion, and transmits the rectilinear motion to the second moving piece 24, by the second ball screw, to move the second moving piece 24 in the Y-axis direction along the guide opening 18a. Note that the X-axis direction and the Y-axis direction are orthogonal to each other, and a plane defined by the X-axis direction and the Y-axis direction is substantially horizontal.

In the present embodiment, as illustrated in FIG. 1, cylindrical first lift means 28 extending downward is connected to a lower surface of a tip of the first moving piece 20, and the ultrasonic wave oscillating unit 6 which is cylindrical in shape is connected to a lower end of the first lift means 28. Therefore, with the first moving piece 20 moved in the Y-axis direction, the first lift means 28 and the ultrasonic wave oscillating unit 6 are moved in the Y-axis direction. The first lift means 28 configured by use of, for example, an electrically driven cylinder having a ball screw and a motor, lifts the ultrasonic wave oscillating unit 6 up and down, and stops the ultrasonic wave oscillating unit 6 at an arbitrary position, whereby the circular end face 6a on the lower side of the ultrasonic wave oscillating unit 6 is made to face the ingot portion corresponding to the wafer to be produced. The ultrasonic wave oscillating unit 6 is formed from a piezoelectric ceramic or the like, and is configured to oscillate an ultrasonic wave.

In the present embodiment, as depicted in FIG. 1, the water supplying unit 8 includes a cylindrical connection port 30 additionally provided at an upper surface of a tip of the first moving piece 20, a nozzle 32 supported on a lower surface of the tip of the first moving piece 20 such as to be liftable up and down, and a nozzle lift mechanism (not depicted) for lifting the nozzle 32 up and down. Therefore, with the first moving piece 20 moved, the water supplying unit 8 is moved in the Y-axis direction. The connection port 30 is connected to a water supply source (not depicted) through a water supply hose (not depicted). The nozzle 32 extends downward from the lower surface of the tip of the first moving piece 20, with a spacing between itself and the ultrasonic wave oscillating unit 6 in the Y-axis direction, then extends in the Y-axis direction toward the ultrasonic wave oscillating unit 6 while being slightly inclined. The nozzle 32 which is hollow communicates with the connection port 30. The nozzle lift mechanism, which may be composed of, for example, an electrically driven cylinder, lifts the nozzle 32 up and down, and stops the nozzle 32 at an arbitrary position, whereby an outlet 32a of the nozzle 32 can be positioned between the ingot portion corresponding to the wafer to be produced and the end face 6a of the ultrasonic wave oscillating unit 6. The water supplying unit 8 supplies water, which is supplied from the water supply source to the connection port 30, to an area between the ingot portion corresponding to the wafer to be produced and the end face 6a of the ultrasonic wave oscillating unit 6, through the outlet 32a of the nozzle 32, to form a layer of water.

Referring to FIG. 1 for continuing the description, cylindrical second lift means 34 extending downward is connected to a lower surface of a tip of the second moving piece 24, and a circular disk-shaped peeling unit 10 is connected to a lower end of the second lift means 34. Therefore, with the second moving piece 24 moved in the Y-axis direction, the second lift means 34 and the peeling unit 10 are moved in the Y-axis direction. The second lift means 34, which may be composed of, for example, an electrically driven cylinder, lifts the peeling unit 10 up and down, and stops the peeling unit 10 at an arbitrary position, whereby a lower surface of the peeling unit 10 can be brought into contact with the ingot portion corresponding to the wafer to be produced. The peeling unit 10 is formed with a plurality of suction holes (not depicted) in a lower surface thereof, and is connected to suction means (not depicted). In a state in which the lower surface of the peeling unit 10 is in contact with the ingot portion corresponding to the wafer to be produced, a suction force is generated at the lower surface of the peeling unit 10 by the suction means, whereby the ingot portion corresponding to the wafer to be produced can be held with suction by the peeling unit 10.

Figure 3A:
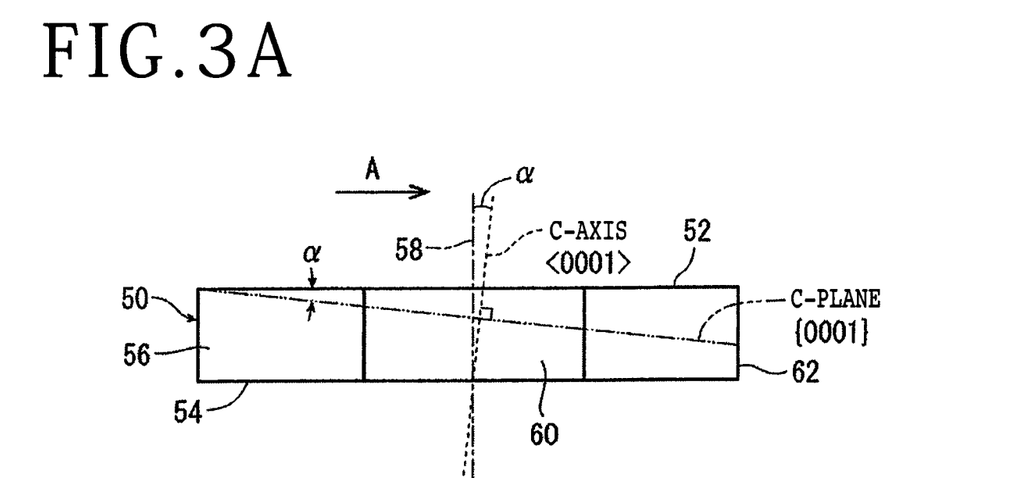
FIG. 3A is a front view of the ingot.
Figure 3B:
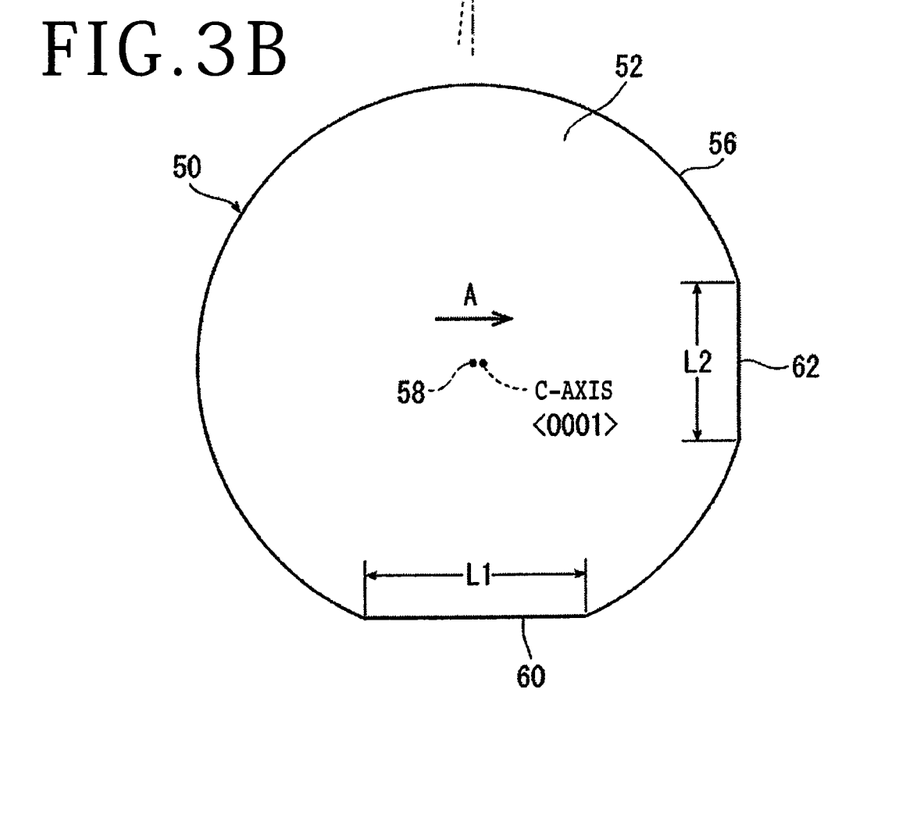
FIG. 3B is a plan view of the ingot.

FIGS. 3A and 3B illustrate an ingot 50 in the state before formed with the peel-off layer. The ingot 50 depicted in the figures is formed from hexagonal single crystal SiC in a cylindrical shape as a whole, and has a circular first end face 52, a circular second end face 54 opposite to the first end face 52, a peripheral surface 56 located between the first end face 52 and the second end face 54, a c-axis (<0001> direction) extending from the first end face 52 to the second end face 54, and a c-plane ({0001} plane) orthogonal to the c-axis. In the ingot 50 depicted in the figures, the c-axis is inclined relative to a perpendicular 58 to the first end face 52, and an off angle $\alpha$ (for example, $\alpha$=1, 3, or 6 degrees) is formed by the c-plane and the first end face 52. The direction A in which the c-axis is inclined relative to the perpendicular 58, or the direction in which the off angle $\alpha$ is formed, is indicated by arrow in FIGS. 3A and 3B. The peripheral surface 56 of the ingot 50 is formed with a first orientation flat 60 and a second orientation flat 62 which are rectangular in shape and indicative of the crystal orientation. The first orientation flat 60 is parallel to the direction A in which the off angle $\alpha$ is formed, and the second orientation flat 62 is orthogonal to the direction A in which the off angle $\alpha$ is formed. As depicted in FIG. 3B, the length L2 of the second orientation flat 62 is shorter than the length L1 of the first orientation flat 60 (L2<L1). Note that the ingot from which the wafer can be peeled off by the above-mentioned peeling apparatus 2 after the formation of the peel-off layer is not limited to the above-mentioned ingot 50; for example, the ingot may be a single crystal SiC ingot in which the c-axis is not inclined relative to the perpendicular to the first end face and the off angle between the c-plane and the first end face is 0 degrees (in other words, the perpendicular to the first end face and the c-axis are coincident with each other), or may be an ingot formed from other material than single crystal SiC, such as Si (silicon) or GaN (gallium nitride).

Figure 4A:
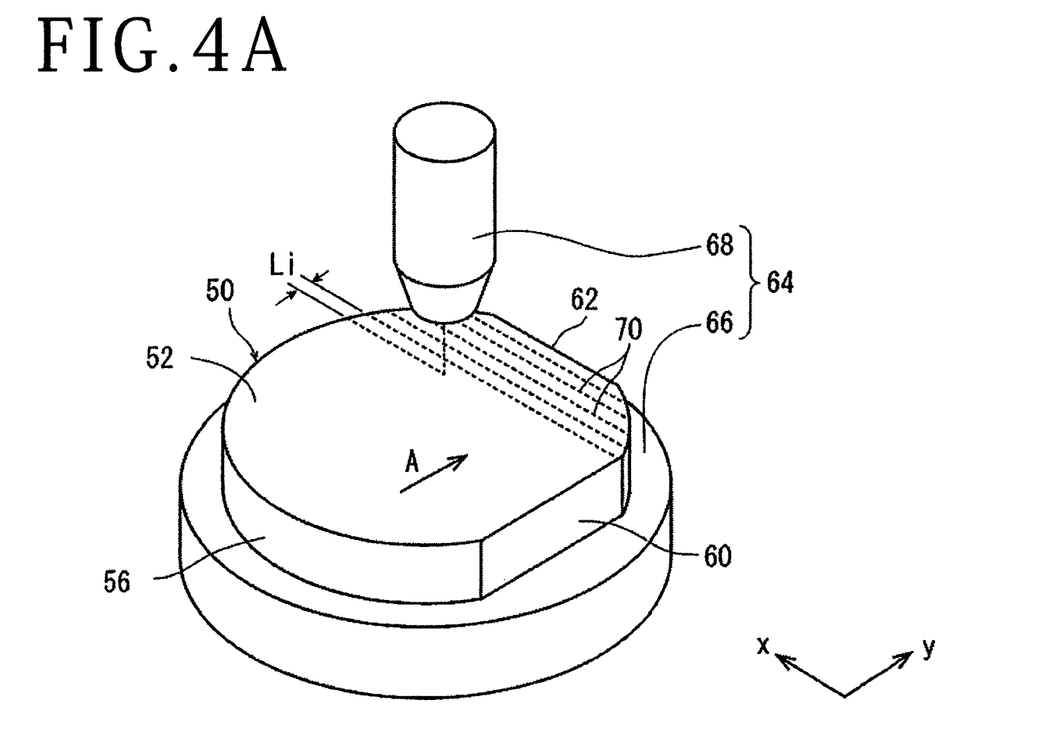
FIG. 4A is a perspective view depicting the manner in which a peel-off layer is formed in the ingot illustrated in FIGS. 3A and 3B.
Figure 4B:
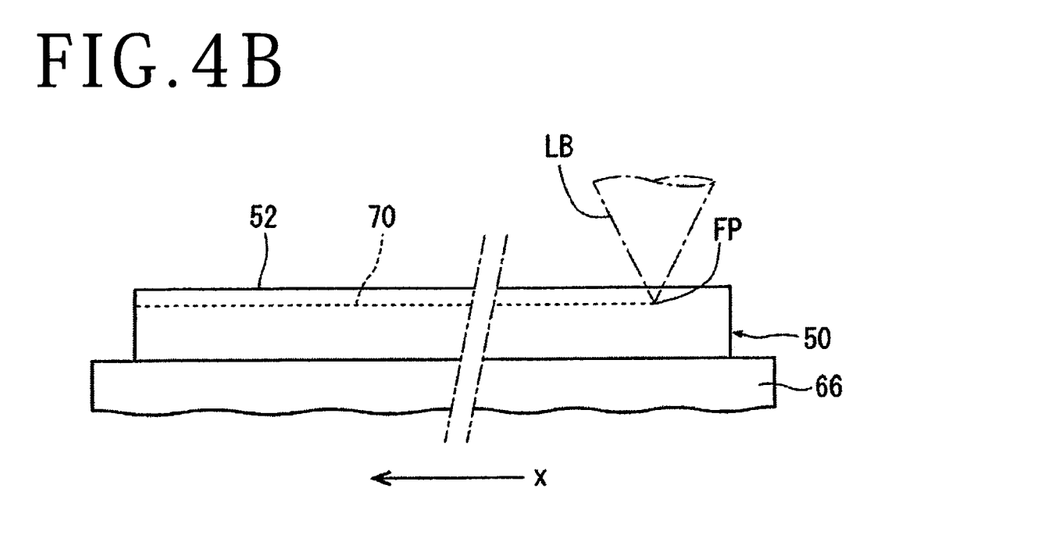
FIG. 4B is a front view depicting the manner in which the peel-off layer is formed in the ingot illustrated in FIGS. 3A and 3B.

In order to peel off the wafer from the ingot 50 by the aforementioned peeling apparatus 2, it is necessary to form the peel-off layer in the ingot 50. The formation of the peel-off layer may be carried out, for example, using a laser processing apparatus 64 part of which is illustrated in FIGS. 4A and 4B. The laser processing apparatus 64 includes a chuck table 66 adapted to hold a workpiece, and a focusing device 68 for applying a pulsed laser beam LB to the workpiece held by the chuck table 66. The chuck table 66 configured to hold the workpiece with suction on an upper surface thereof is rotated around an axis extending in the vertical direction by rotating means (not depicted), is moved forward and backward in an x-axis direction by x-axis direction moving means (not depicted), and is moved forward and backward in a y-axis direction by y-axis direction moving means (not depicted). The focusing device 68 includes a focusing lens (not depicted) for focusing the pulsed laser beam LB oscillated by a pulsed laser beam oscillator (not depicted) of the laser processing apparatus 64 to apply the pulsed laser beam LB to the workpiece. Note that the x-axis direction is a direction indicated by arrow x in FIGS. 4A and 4B, and the y-axis direction is a direction indicated by arrow y in FIG. 4A and orthogonal to the x-axis direction. A plane defined by the x-axis direction and the y-axis direction is substantially horizontal. In addition, the X-axis direction and the Y-axis direction denoted by capitals X and Y in FIGS. 1 and 2 and the x-axis direction and the y-axis direction denoted by letters x and y in FIGS. 4A and 4B may be coincident with each other or may be different from each other.

Figure 5A:
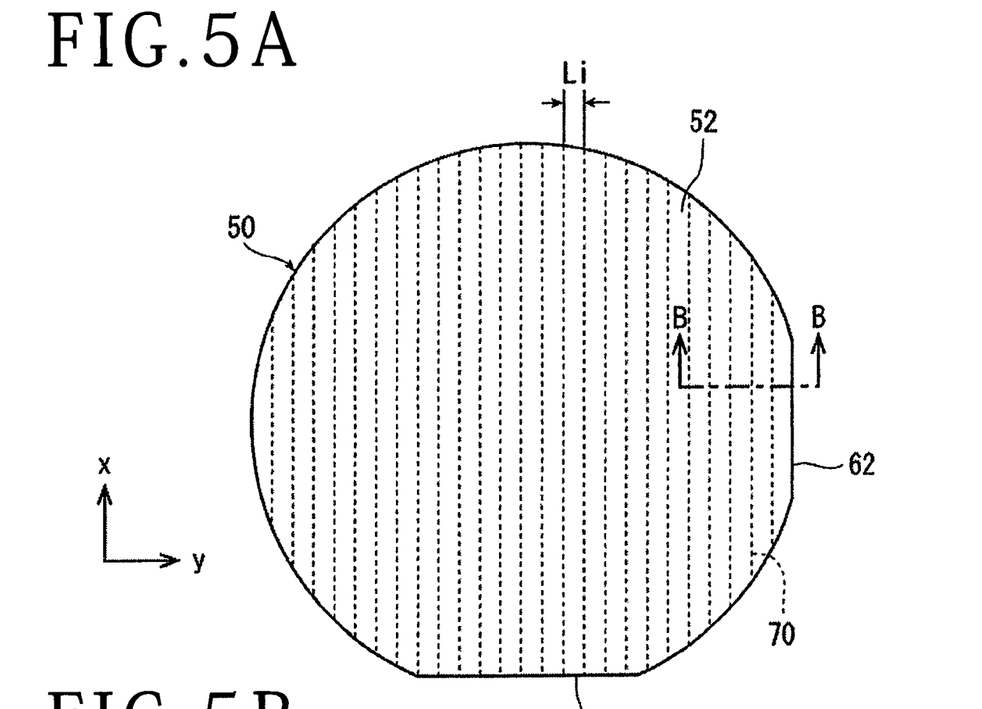
FIG. 5A is a plan view of the ingot formed therein with the peel-off layer.
Figure 5B:
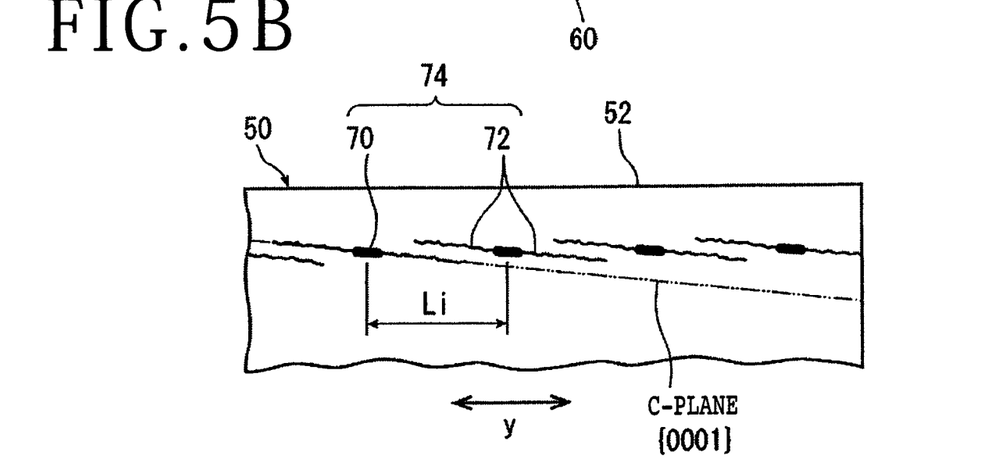
FIG. 5B is a sectional view taken along line B-B of FIG. 5A.

Referring to FIGS. 4A and 4B for continuing the description, at the time of forming the peel-off layer in the ingot 50, first, the ingot 50 is held with suction on the upper surface of the chuck table 66, with one of the end faces of the ingot 50 (in the present embodiment, the first end face 52) faced up. Alternatively, the ingot 50 may be fixed to the chuck table 66 by interposing an adhesive (for example, an epoxy resin adhesive) between the other of the end faces of the ingot 50 (in the present embodiment, the second end face 54) and the upper surface of the chuck table 66. Next, the ingot 50 is imaged from above the ingot 50 by imaging means (not depicted) of the laser processing apparatus 64. Subsequently, based on an image of the ingot 50 picked up by the imaging means, the chuck table 66 is moved and rotated by the x-axis direction moving means, the y-axis direction moving means and the rotating means, whereby the orientation of the ingot 50 is adjusted to a predetermined direction, and the positions of the ingot 50 and the focusing device 68 in the xy plane are adjusted. At the time of adjusting the orientation of the ingot 50 to the predetermined direction, as illustrated in FIG. 4A, the second orientation flat 62 is aligned with the x-axis direction to align a direction orthogonal to the direction A in which the off angle $\alpha$ is formed with the x-axis directions and also to align the direction A in which the off angle $\alpha$ is formed with the y-axis directions. Next, the focusing device 68 is lifted up or down by focal point position control means (not depicted) of the laser processing apparatus 64, to position the focal point FP at a depth corresponding to the thickness of the wafer to be produced from the first end face 52 of the ingot 50, as depicted in FIG. 4B. Subsequently, while moving the chuck table 66 in the x-axis direction aligned with the direction orthogonal to the direction A in which the off angle α is formed, a peel-off layer forming processing is carried out in which a pulsed laser beam LB of such a wavelength as to be transmitted through single crystal SiC is applied through the focusing device 68 to the ingot 50. When the peel-off layer forming processing is conducted, as depicted in FIGS. 5A and 5B, a modified portion 70 in which SiC is separated into Si (silicon) and C (carbon) by application of the pulsed laser beam LB, the pulsed laser beam LB applied next is absorbed in the previously formed C, and SiC is separated into Si and C in a chain reaction manner is formed continuously in the direction orthogonal to the direction A in which the off angle α is formed, and cracks 72 extending isotropically along the c-plane from the modified portion 70 are formed.

Referring to FIGS. 4A, 4B, 5A and 5B for continuing the description, after the peel-off layer forming processing, index feeding is conducted in which the chuck table 66 is index fed relative to the focal point FP in the y-axis direction aligned with the direction A in which the off angle α is formed by a predetermined indexing amount Li not exceeding the width of the crack 72. Then, the peel-off layer forming processing and the indexing feeding are alternately repeated, whereby a plurality of the modified portions 70 extending continuously in the direction orthogonal to the direction A in which the off angle α is formed are formed at intervals of the predetermined indexing amount Li in the direction A in which the off angle α is formed, and the cracks 72 extending isotropically along the c-plane from the modified portions 70 are sequentially formed, such that the crack 72 and the crack 72 adjacent to each other in the direction A in which the off angle α is formed overlap each other as viewed in the vertical direction. By this, the peel-off layer 74 which is composed of the pluralities of modified portions 70 and cracks 72 can be formed at the depth corresponding to the thickness of the wafer to be produced from the first end face 52 of the ingot 50. The peel-off layer 74 has a lower mechanical strength than the remainder of the ingot 50, so that a wafer can be peeled off from the ingot 50 along the peel-off layer 74, as described later. Note that the formation of the peel-off layer 74 may be carried out in the following processing conditions.

Figure 6:
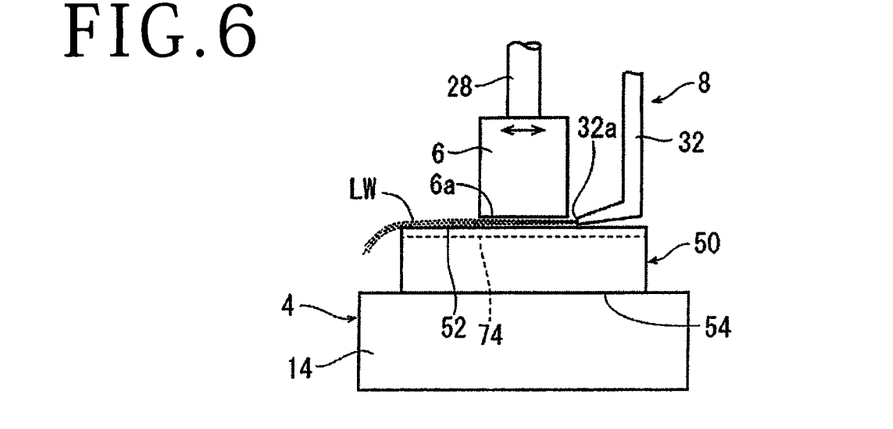
FIG. 6 is a front view of the peeling apparatus, depicting a state in which an ultrasonic wave is applied to the ingot.

Wavelength of pulsed laser beam: 1,064 nm
Repetition frequency: 60 kHz
Average output: 1.5 W
Pulse width: 4 ns
Diameter of focal point: 3 μm
Numerical aperture (NA) of focusing lens: 0.65
Vertical position of focal point: 300 μm from first end face of ingot
Feeding speed: 200 mm/s
Indexing amount: 250 μm to 400 μm A peeling method of peeling off the wafer from the ingot 50 formed with the peel-off layer 74 by use of the aforementioned peeling apparatus 2 will be described. In the present embodiment, as depicted in FIG. 2, the ingot 50 is held by the ingot holding unit 4 in a state in which the ingot portion corresponding to the wafer to be produced (the first end face 52 side of the ingot 50 which is closer to the peel-off layer 74) is faced up. In this instance, the ingot 50 may be fixed to the holding table 14 by interposing an adhesive (for example, an epoxy resin adhesive) between the second end face 54 of the ingot 50 and the upper surface of the holding table 14, or the ingot 50 may be held with suction by generating a suction force at the upper surface of the holding table 14. Next, the first moving piece 20 is moved by the first motor 22 of the Y-axis direction moving mechanism 16, whereby the end face 6a of the ultrasonic wave oscillating unit 6 is faced to the ingot portion corresponding to the wafer to be produced (in the present embodiment, the portion from the first end face 52 to the peel-off layer 74). Subsequently, the ultrasonic wave oscillating unit 6 is lowered by the first lift means 28, and, when the spacing between the first end face 52 and the end face 6a of the ultrasonic wave oscillating unit 6 becomes a predetermined size (for example, approximately 2 mm to 3 mm), the operation of the first lift means 28 is stopped. In addition, the nozzle 32 is moved by the nozzle lift mechanism, to position the outlet 32a of the nozzle 32 between the first end face 52 and the end face 6a. Next, while rotating the holding table 14 by the motor and moving the first moving piece 20 in the Y-axis direction by the first motor 22 as depicted in FIG. 6, water is supplied from the outlet 32a of the nozzle 32 to an area between the first end face 52 and the end face 6a, to form a layer of water LW, and an ultrasonic wave is oscillated from the ultrasonic wave oscillating unit 6. In this instance, the holding table 14 is rotated and the first moving piece 20 is moved in the Y-axis direction such that the ultrasonic wave oscillating unit 6 passes over the whole area of the first end face 52, whereby the ultrasonic wave is applied to the whole part of the peel-off layer 74. By this, the ultrasonic wave can be transmitted to the ingot 50 through the layer of water LW, to cause the cracks 72 of the peel-off layer 74 to extend, thereby further lowering the strength of the peel-off layer 74. Subsequently, the operation of the ultrasonic wave oscillating unit 6 is stopped, and the operation of the water supply source is stopped.

Figure 7:
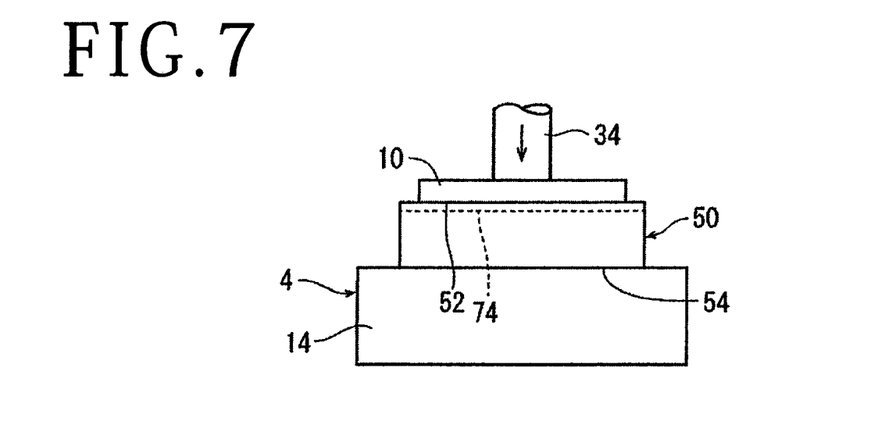
FIG. 7 is a front view of the peeling apparatus, depicting a state in which an ingot portion corresponding to a wafer is held with suction by a peeling unit.
Figure 8:
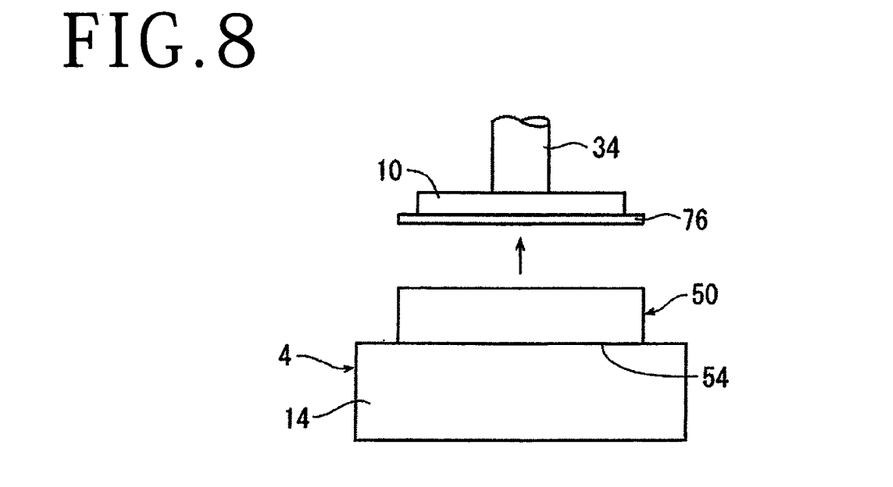
FIG. 8 is a front view of the peeling apparatus, depicting a state in which the wafer has been peeled off from the ingot, with the peel-off layer as a starting point of peeling.

After the cracks 72 of the peel-off layer 74 are caused to extend as above-mentioned, the first moving piece 20 is moved by the first motor 22, the ultrasonic wave oscillating unit 6 and the nozzle 32 are spaced from the upper side of the ingot 50, and the second moving piece 24 is moved by the second motor 26, to position the peeling unit 10 at a position on the upper side of the ingot 50. Next, as illustrated in FIG. 7, the peeling unit 10 is lowered by the second lift means 34, to bring the lower surface of the peeling unit 10 into contact with the first end face 52. Subsequently, the suction means connected to the peeling unit 10 is operated, to generate a suction force at the lower surface of the peeling unit 10, whereby the ingot portion corresponding to the wafer to be produced is held with suction by the peeling unit 10. Next, the peeling unit 10 is moved upward by the second lift means 34. By this, as depicted in FIG. 8, the wafer 76 to be produced can be peeled off from the ingot 50, with the peel-off layer 74 as a starting point of peeling.

As has been described above, the peeling apparatus 2 in the present embodiment includes the ingot holding unit 4 adapted to hold the ingot 50 with the ingot portion corresponding to the wafer being faced up, the ultrasonic wave oscillating unit 6 which has the end face 6a facing the ingot portion corresponding to the wafer and oscillates an ultrasonic wave, the water supplying unit 8 adapted to supply water to an area between the ingot portion corresponding to the wafer and the end face 6a of the ultrasonic wave oscillating unit 6, and the peeling unit 10 which holds the ingot portion corresponding to the wafer with suction and peels off the wafer from the ingot 50. Therefore, the wafer 76 can be easily peeled off from the ingot 50, with the peel-off layer 74 as a starting point of peeling. In addition, in the present embodiment, water is supplied from the water supplying unit 8 to the area between the ingot portion corresponding to the wafer and the end face 6a of the ultrasonic wave oscillating unit 6, to form the layer of water LW between the ingot portion corresponding to the wafer and the end face 6a of the ultrasonic wave oscillating unit 6, thereby transmitting the ultrasonic wave to the ingot 50 through the layer of water LW. Therefore, the wafer 76 can be peeled off from the ingot 50 without using a water tank, so that the time for filling up the water tank with water and the amount of water to be used can be saved, which is economical.

Note that in the present embodiment, an example has been described in which at the time of forming the peel-off layer 74 in the ingot 50, the ingot 50 is moved relative to the focal point FP in the direction orthogonal to the direction A in which the off angle α is formed, and, in the indexing feeding, the ingot 50 is moved relative to the focal point FP in the direction A in which the off angle α is formed. However, the direction of relative movement of the ingot 50 and the focal point FP at the time of forming the peel-off layer 74 in the ingot 50 may not be the direction orthogonal to the direction A in which the off angle α is formed, and the direction of relative movement of the ingot 50 and the focal point FP in the indexing feeding may not be the direction A in which the off angle α is formed. In addition, while an example in which the first lift means 28 for lifting the ultrasonic wave oscillating unit 6 up and down and the nozzle lift mechanism for lifting the nozzle 32 up and down are separated from each other has been described in the present embodiment, the ultrasonic wave oscillating unit 6 and the nozzle 32 may be lifted up and down by a common lift mechanism provided on the first moving piece 20. Alternatively, the ultrasonic wave oscillating unit 6 and the nozzle 32 and the peeling unit 10 may be lifted up and down by lifting up and down the frame body 18 of the Y-axis direction moving mechanism 16.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A peeling apparatus for peeling off a wafer from an ingot formed therein with a peel-off layer by applying a laser beam of such a wavelength as to be transmitted through the ingot, with a focal point of the laser beam positioned at a depth corresponding to a thickness of the wafer, the peeling apparatus comprising:
   an ingot holding unit holding the ingot with an ingot portion corresponding to the wafer being faced up; and
   a moving mechanism attached to:
   an ultrasonic wave oscillating unit having an end face facing the ingot portion corresponding to the wafer and which oscillates an ultrasonic wave;
   a water supplying unit supplying water to an area between the ingot portion corresponding to the wafer and the end face of the ultrasonic wave oscillating unit; and
   a peeling unit configured to hold the ingot portion corresponding to the wafer with suction and peels off the wafer from the ingot,
   wherein the moving mechanism moves the ultrasonic wave oscillating unit, the water supplying unit and the peeling unit.

2. The peeling apparatus according to claim 1, wherein the ingot is a single crystal SiC ingot having a c-axis and a c-plane orthogonal to the c-axis, and
   the peel-off layer is a peel-off layer including a modified portion and a crack, the modified portion and the crack being formed by a process in which the laser beam is applied to the single crystal SiC ingot, with the focal point of the laser beam positioned at the depth corresponding to the thickness of the wafer from an end face of the single crystal SiC ingot, to form the modified portion in which SiC has been separated into Si and C and the crack which is formed isotropically in the c-plane.

3. The peeling apparatus according to claim 2,
   wherein the ingot is the single crystal SiC ingot in which the c-axis is inclined relative to a perpendicular to the end face of the single crystal SiC ingot and an off angle is formed by the c-plane and the end face of the single crystal SiC ingot, and
   the peel-off layer is formed by forming the modified portion continuously in a direction orthogonal to the direction in which the off angle is formed and forming the crack isotropically in the c-plane, and putting the single crystal SiC ingot and the focal point into relative indexing feeding in the direction in which the off angle is formed, in such a range as not to exceed the width of the crack, to form the modified layer continuously in the direction orthogonal to the direction in which the off angle is formed and to sequentially form cracks isotropically in the c-plane from the modified portion.

4. The peeling apparatus according to claim 1, wherein the moving mechanism is attached to a first moving piece and a second moving piece, said first moving piece including said ultrasonic wave oscillating unit and said water supplying unit and said second moving piece including said peeling unit, wherein said first moving piece and said second moving piece are moved independently of each other.

5. The peeling apparatus according to claim 4, wherein said first moving piece and said second moving piece are each moved in a direction parallel to a surface of the ingot and said ultrasonic wave oscillating unit and said peeling unit are each moved transversely to the surface of the ingot.

6. The peeling apparatus according to claim 1, wherein said water supplying unit includes a nozzle that directs water to an area between the ultrasonic wave oscillating unit and the ingot.

* * * * *